US011798614B2

(12) United States Patent
Lin et al.

(10) Patent No.: US 11,798,614 B2
(45) Date of Patent: Oct. 24, 2023

(54) AUTOMATED VOLTAGE DEMARCATION (VDM) ADJUSTMENT FOR MEMORY DEVICE

(71) Applicant: MICRON TECHNOLOGY, INC., Boise, ID (US)

(72) Inventors: Yi-Min Lin, San Jose, CA (US); Fangfang Zhu, San Jose, CA (US); Chih-Kuo Kao, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/463,274

(22) Filed: Aug. 31, 2021

(65) Prior Publication Data

US 2023/0069439 A1 Mar. 2, 2023

(51) Int. Cl.
*G11C 11/4074* (2006.01)
*G11C 29/42* (2006.01)
*G11C 11/4096* (2006.01)
*G11C 11/4076* (2006.01)

(52) U.S. Cl.
CPC ...... *G11C 11/4074* (2013.01); *G11C 11/4076* (2013.01); *G11C 11/4096* (2013.01); *G11C 29/42* (2013.01)

(58) Field of Classification Search
CPC ............ G11C 11/4074; G11C 11/4076; G11C 11/4096; G11C 29/42
See application file for complete search history.

(56) References Cited

U.S. PATENT DOCUMENTS

| 7,957,185 | B2 | 6/2011 | Li et al. |
| 9,152,416 | B2 | 10/2015 | Nakanishi et al. |
| 2019/0043571 | A1 | 2/2019 | Damle et al. |
| 2019/0102320 | A1 | 4/2019 | Hillier et al. |
| 2021/0225447 | A1 | 7/2021 | Akel et al. |

FOREIGN PATENT DOCUMENTS

KR 101629184 B1 * 12/2014

OTHER PUBLICATIONS

Method for Calling Periodic Function to Enhance Process Speed of EEPROM in Autosar; Jeong Jeong Han (Year: 2014).*
International Search Report and Written Opinion received for PCT Application No. PCT/US2022/042080, dated Dec. 23, 2022.

* cited by examiner

*Primary Examiner* — Sultana Begum
(74) *Attorney, Agent, or Firm* — Lowenstein Sandler LLP

(57) ABSTRACT

A system can include a memory devices and a processing device coupled with the memory devices. The processing device can receive a command and determine whether the command includes a value for a voltage associated with a read at the memory device. The processing device can also, responsive to the command failing to specify the value, select a second value, from multiple values, for the voltage associated with the read at the memory device based at on a duration subsequent to a previous write operation satisfying a threshold criterion. The processing device can also apply the voltage having the second value at memory cells of the memory device to determine a logic state for the memory cells.

20 Claims, 6 Drawing Sheets

AUTOMATED VOLTAGE DEMARCATION (VDM) ADJUSTMENT FOR MEMORY DEVICE

TECHNICAL FIELD

Embodiments of the disclosure relate generally to memory sub-systems, and more specifically, relate to a concurrent command limiter for a memory system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
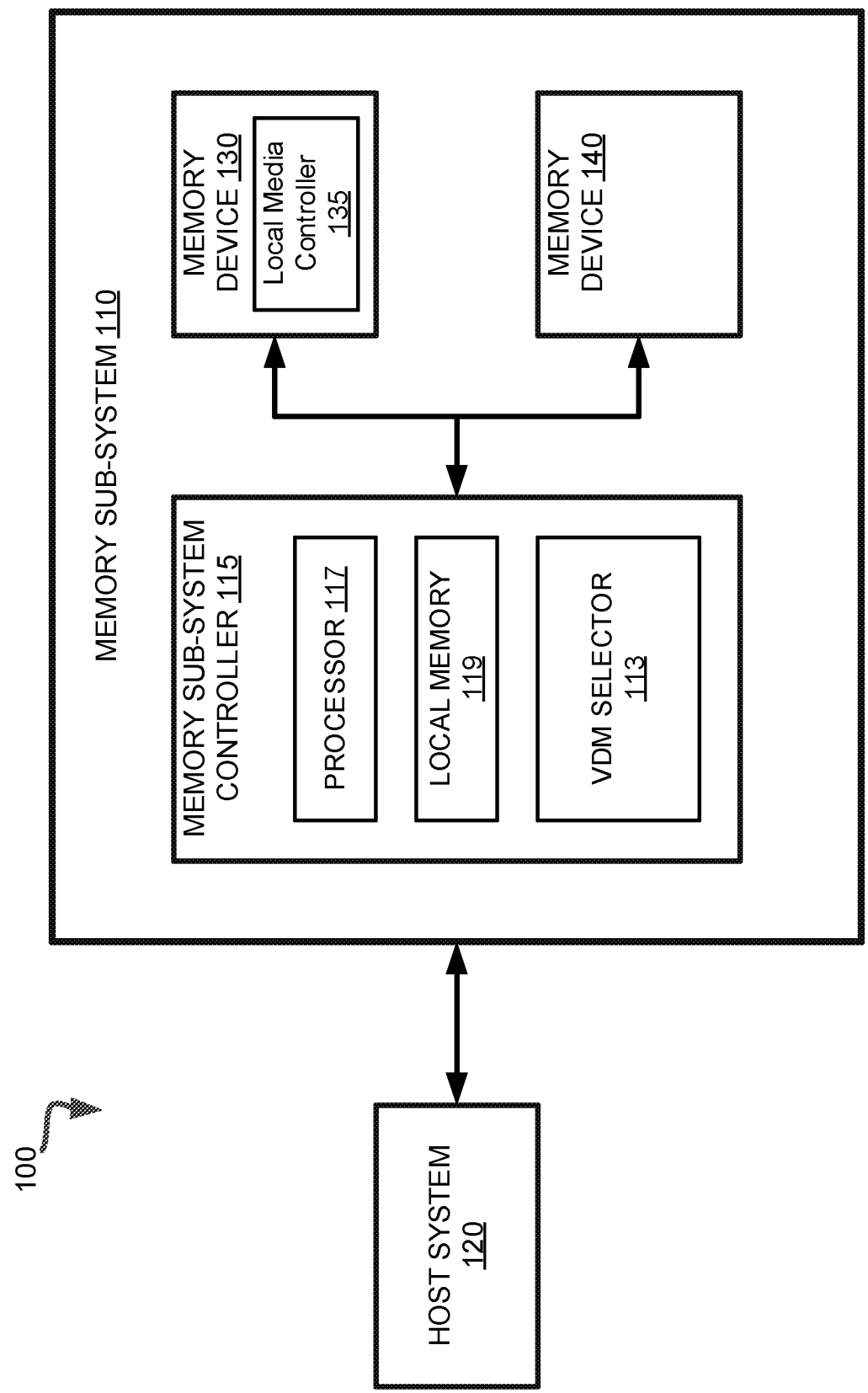
FIG. 1 illustrates an example computing system that includes a memory sub-system in accordance with some embodiments of the present disclosure.

Aspects of the present disclosure are directed to a method for an automated voltage demarcation adjustment a memory system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Other examples of non-volatile memory devices are described below in conjunction with FIG. 1. That is, the embodiment is not limited to three-dimensional cross-point or other memory technologies. A non-volatile memory device is a package of one or more dies. Each die can consist of one or more partitions. For some types of non-volatile memory devices (e.g., 3D cross-point devices), each partition consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Three-dimensional (3D) cross-point memory devices can group pages across dice and channels to form management units (MUs). An MU can include host data and corresponding metadata. A memory sub-system controller can send and receive user data and corresponding metadata as management units to and from memory devices. A super management unit (SMU) is a group of one or more MUs that are managed together. For example, a memory sub-system controller can perform media management operations (e.g., wear level operations, refresh operations, etc.) on SMUs. The memory sub-system controller can also perform write or read operations on SMUs.

Certain non-volatile memory devices can use a demarcation voltage (or voltage demarcation (VDM)) to read data stored at memory cells. For example, the memory sub-system controller can apply the VDM to memory cells and if the threshold voltage (Vt) of a particular memory cell is identified as being below the demarcation voltage applied, then the data stored at the particular memory cell can be read as a particular value (e.g., a logical '1'). If the threshold voltage of the particular memory cell is identified as being above the demarcation voltage, then the data stored at the particular memory cell can be read as another value (e.g., a logical '0'). In certain memory devices, a threshold voltage or the threshold voltage distribution of multiple memory cells can shift or change over time, also referred to as voltage threshold drift. For example, a threshold voltage distribution of memory cells storing a logical '1' or a threshold distribution of memory cells storing a logical '0' can drift over time and the respective threshold voltage of a distribution can increase. When the threshold voltage of a memory cell changes, the application of the demarcation voltage can yield an incorrect result due to the changed threshold voltage—e.g., the data stored at the memory cell can be incorrectly interpreted when the threshold value of the memory cell drifts from below the VDM to above the VDM. Certain memory devices can utilize multiple VDMs having different values (e.g., multiple VDM levels) to compensate inaccurate readings due to drift. For example, the memory device can select a different VDM (e.g., a VDM with a greater magnitude or higher value) as the drift causes the memory threshold voltage to increase. Memory devices can adjust the VDM when a different VDM is specified in a command received from a host system, apply the VDM, and perform error correction operations (e.g., ECC) until a number of errors satisfies an error threshold of the memory device—e.g., the host system can stop sending different VDMs until the error threshold is satisfied. In such examples, applying each VDM can slow down performance of the memory device. Additionally, certain memory devices can be limited in the number of VDM values they can select from, increasing the chances of misreading the memory cells using the limited VDMs.

Certain memory devices can also utilize the VDM when performing recovery operations and attempting to correct corrupted codewords—e.g., a set of standardized data where each codeword follows the same protocol. For example, the memory device can store several codewords at a page. The codewords stored at memory cells of the page can become corrupted over time due to degradation or threshold drift. The memory device can attempt to decode the data stored at the corrupted codeword using redundancy metadata associated with all the codewords at the page (e.g., an exclusive or (XOR) value) stored at the page. The memory device can use different VDMs to attempt a recovery of the codeword. Certain memory devices can have a limited number of VDM to select from and recovery of the codeword can be difficult. Certain memory devices can also have no limits on what VDM value can be used, causing the memory device to exceed threshold voltages—e.g., the memory device can apply a voltage to the memory cells that exceeds or is below the operational voltage of the memory cell.

Aspects of the present disclosure address the above and other deficiencies by having a memory sub-system that can adjust the VDM in an automated fashion. For example, the memory sub-system controller includes logic that can select a VDM value without relying on the command from the host system to specify a value. For example, the memory sub-system controller can select a VDM value from several possible VDMs that is best suited to compensate for the threshold voltage drift. For performing a memory access operation with respect to a SMU, the memory sub-system can select the VDM based on the period of time that has elapsed since the most recent write operation has been performed with respect to that SMU. Accordingly, the memory sub-system controller can select a different VDM value if the elapsed time satisfies (e.g., exceeds) a programmed threshold criterion—e.g., the memory sub-system controller can select a VDM with a higher value when the time since the last write operation is high since the memory cells can drift more over the longer time. The memory sub-system controller can also select between additional VDM voltages (e.g., voltages with different values or magnitudes), than certain memory devices. The memory sub-system controller can also use an automated VDM adjustment for the recovery by increasing the VDM for each recovery step—e.g., increasing the VDM until errors are reduced or the maximum operational voltage of the memory cell is met.

Advantages of the present disclosure include, but are not limited to, reducing read latencies by selecting one VDM via automation instead of receiving multiple commands with different VDMs. The memory sub-system controller can also selected from more VDM voltages than certain memory devices, allowing the memory sub-system to improve drift mitigation. The memory sub-system can also include a register that monitors whether a selected VDM value exceeds or falls below the operational voltages of the memory cells. Accordingly, the memory sub-system controller can protect them memory cells and avoid applying invalid VDM voltages that exceed or are below the operational voltages.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a demarcation voltage (voltage demarcation (VDM)) selector 113 that can allow the memory sub-system 110 to select a VDM from multiple possible VDMs best suited to compensate for inaccurate readings due to drift. In some embodiments, the memory sub-system controller 115 includes at least a portion of the VDM selector 113. In some embodiments, the VDM selector 113 is part of the host system 110, an application, or an operating system. In other embodiments, local media controller 135 includes at least a portion of VDM selector 113 and is configured to perform the functionality described herein.

The VDM selector 113 can select a VDM (e.g., a voltage at a respective value) from several possible VDMs to compensate for effects from voltage threshold drift. In some embodiments, the memory sub-system controller 115 can activate the VDM selector by writing a value to a certain register. If the VDM selector 113 is deactivated, the memory sub-system controller 115 can use a default VDM value—e.g., a preprogrammed value based on characteristics of the memory sub-system 110. For example, the default VDM can be selected based on a voltage threshold of a memory cell or a drift of rate of the memory cells. In at least one embodiment, the VDM selector 113 can be active. In such embodiments, the VDM selector 113 can select a VDM based on a time elapsed since a last write operation at a given SMU of the memory sub-system 110. That is, the VDM selector 113 can select a different VDM for a given SMU based on the time elapsed since the last write operation. The VDM selector 113 can store one or more threshold times, each threshold time associated with a different VDM value—e.g., a first threshold time can be associated with a first VDM value. If the memory sub-system 113 determines the time elapsed does not exceed (e.g., satisfies) a threshold time, the VDM selector 113 can proceed to check a next threshold time until the elapsed time satisfies the threshold. If the elapsed time does not exceed any time threshold, the VDM selector 113 can select the VDM default value.

The VDM selector 113 can also select a VDM for a recovery operation. For example, the memory sub-system controller 115 can use a VDM to attempt to recover a corrupted codeword. The VDM selector 113 can start with an initial VDM value—e.g., the voltage used to initially read the memory cells as selected by a method described above. If an error correction operation (ECC) determines the number of errors associated with the codeword still exceed an error threshold (e.g., the codeword is still corrupted), the VDM selector 113 can increase the VDM to the next possible value. The VDM selector 113 can continue to increase the VDM if the respective selected VDM does not recover the corrupted codeword up to a maximum VDM—e.g., the maximum threshold voltage of the memory cells or the maximum VDM the VDM selector 113 can select.

Figure 2:
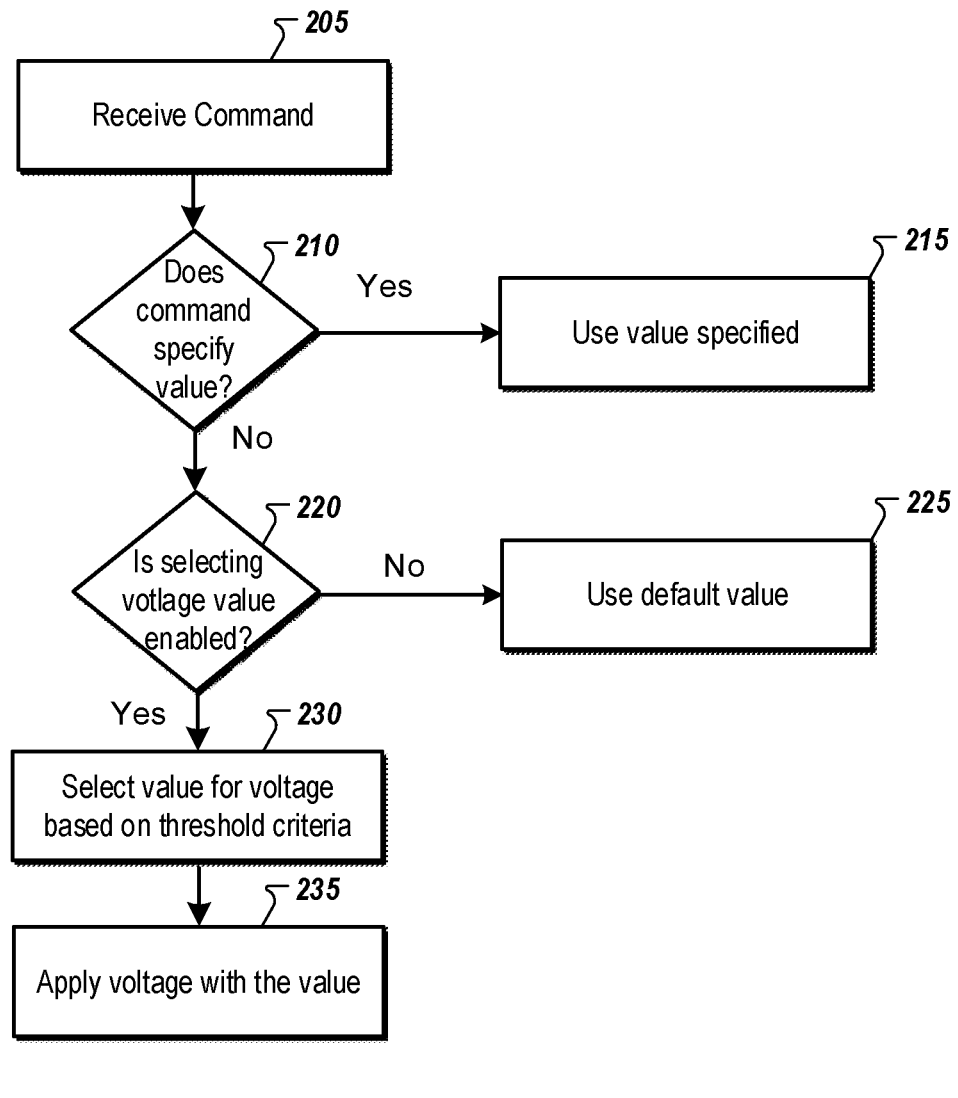
FIG. 2 is a flow diagram of an example method for automated voltage demarcation adjustment for a memory device.

FIG. 2 is a flow diagram of an example method 200 to select a VDM autonomously for a memory sub-system in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the VDM selector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing logic can receive a memory access command from a host system (e.g., host system 120). In at least one embodiment, the processing logic can receive a read command or a write command. In some embodiments, the processing logic can receive a force write command. In some embodiments, the processing logic can use a demarcation voltage (VDM or voltage associated with a read) while performing the command. For example, the processing logic can use the VDM while performing a read operation to determine a logic state of a memory cell. For example, the memory device can apply the VDM to memory cells and if a threshold voltage (Vt) of a particular memory cell is identified as being below the VDM, the memory cell can be determined to have a first logic value ('1') and if the threshold voltage of the particular memory cell is identified as being above the VDM, the memory cell can be determined to have a second logic value '0'. In some embodiments, the processing logic can perform read back operations as part of a write operation or a forced write operation. In some embodiments, the processing logic can be configured to select a VDM value from several possible VDM values—e.g., from a plurality of values or from a plurality of predefined VDM values.

At operation 210, the processing logic can determine whether the command from the host system specifies (e.g., comprises) a value (e.g., magnitude) for the VDM applied to the memory cells. In some embodiments, the host system can specify which VDM to use while performing a read operation. In such embodiments, the host system can send a command with a value '1' in a VDM read enable field of the command. If the host system does not specify which VDM to use, the host system can send a command with a value '0' in the VDM read enable field. Accordingly, the processing logic can determine whether the command specifies a VDM value based on reading a '1' or a '0.' If the processing logic reads a value '1' the processing logic can proceed to operation 215. If the processing logic reads a value '0' the processing logic can proceed to operation 220.

At operation 215, the processing logic can use the value specified in the command. In some embodiments, the processing logic can read the value specified in the VDM_RD field of the command—e.g., the processing logic can read the command field to determine which VDM value to select. The processing logic can subsequently apply a VDM having the value specified in the command to determine the logic states of the memory cells. In at least one embodiment, the processing logic can use a predetermined value when a force write command is received. For example, the processing logic can use a first value (e.g., VDM0) each time a forced write command is received, even if the forced write command does not include the VDM value.

At operation 220, the processing logic can determine whether to select a VDM voltage by reading a value from a register. In at least one embodiment, the processing logic can read a value from a register. The value at the register can indicate a first configuration or a second configuration. In at least one embodiment, the processing logic can store a value at the register to indicate whether to utilize threshold criterion. For example, the processing logic can store a value '1' to indicate to use the threshold criterion to select a VDM voltage. In at least on embodiment, the processing logic can store a value '0' to indicate to not use the threshold criterion. The processing logic can write the value to the register based on a setting at manufacturing (e.g., based on processing power or read latencies of the memory device) or write the value to the register based on a host command or user input. The processing logic can subsequently read the register value after receiving the command to determine if the processing logic should use the threshold criterion to select the VDM. If the processing logic reads a value '1' at the threshold enabled register, the processing logic can proceed to operation 230. If the processing logic reads a value '0' at threshold enable register, processing logic can proceed to operation 225.

At operation 225, the processing logic can select the default VDM value. In at least on embodiment, the VDM can be associated with a default value or magnitude. For example, the processing logic can set a default VDM value before a command is received. The default value can be selected based on a voltage threshold of a memory cell or a drift of rate of the memory cells.

At operation 230, the processing logic can select a value for the VDM based on a threshold criteria. In some embodiments, the processing logic can select the VDM value based on a period of time that has elapsed since the most recent write operation that has been performed with respect to a given SMU. For example, the longer memory cells are unwritten to, the more that drift can occur. Accordingly, the processing logic can track the time elapsed since the last write operation to compensate for the effects of the drift. In at least one embodiment, the period of time that has elapsed since the write operation can be tracked for each SMU. The processing logic can store a writestamp (e.g., a time value) when it performs a write. The processing logic can also track the current time (e.g., a current time stamp, SMU time stamp, or second time value). Accordingly, when a command is received, the processing logic can take a difference of the current time and the time at which the write operation occurred to determine the elapsed time since the write operation. If the processing logic receives a write command, the processing logic can record a new writestamp. Accordingly, when a new command is received after recording the new writestamp, the processing logic can determine the time elapsed by taking a difference between the current time and the new writestamp. The processing logic can subsequently compare the elapsed time with several preprogrammed threshold criterion (values). These values can be determined by a voltage threshold of a memory cell or a drift of rate of the memory cells. For example, the processing logic can determine a first threshold and first VDM to use when a first amount of time has elapsed based on a drift rate of the memory cells—e.g., a first VDM to use to compensate for drift that can have occurred during the first time. In some embodiments, the processing logic can compare the determined period of time since the most recent write operation with a highest threshold criterion. If the processing logic determines the period of time that has elapsed does not exceed the highest threshold, the processing logic can go the second highest threshold, and so forth until either a threshold is satisfied or the processing logic has exhausted all possible threshold criterion. If the processing logic does exhaust the possible threshold criteria, the processing logic can use the default VDM. If the processing logic does determine the period of time that has elapsed satisfies a threshold, the processing logic can select the corresponding VDM value. If the processing logic receives a subsequent command, the processing logic can select a different VDM if the writestamp stored is the same but the current time is different—e.g., select a second value for the VDM based on the elapsed time period satisfying a higher threshold. In some embodiments, the thresholds can be different for read and write commands. For example, the processing logic can store a first number of thresholds for read commands and a second number of thresholds for a write command. That is, the threshold criteria for read operation can have different values than threshold criteria for write operations.

At operation 235, the processing logic can apply the value selected at operation 230. In some embodiments, the processing logic can apply the VDM with the value selected to memory cells at an SMU or MU. The processing logic can determine logic values of the memory cells by applying the VDM with the selected value as described above.

Figure 3:
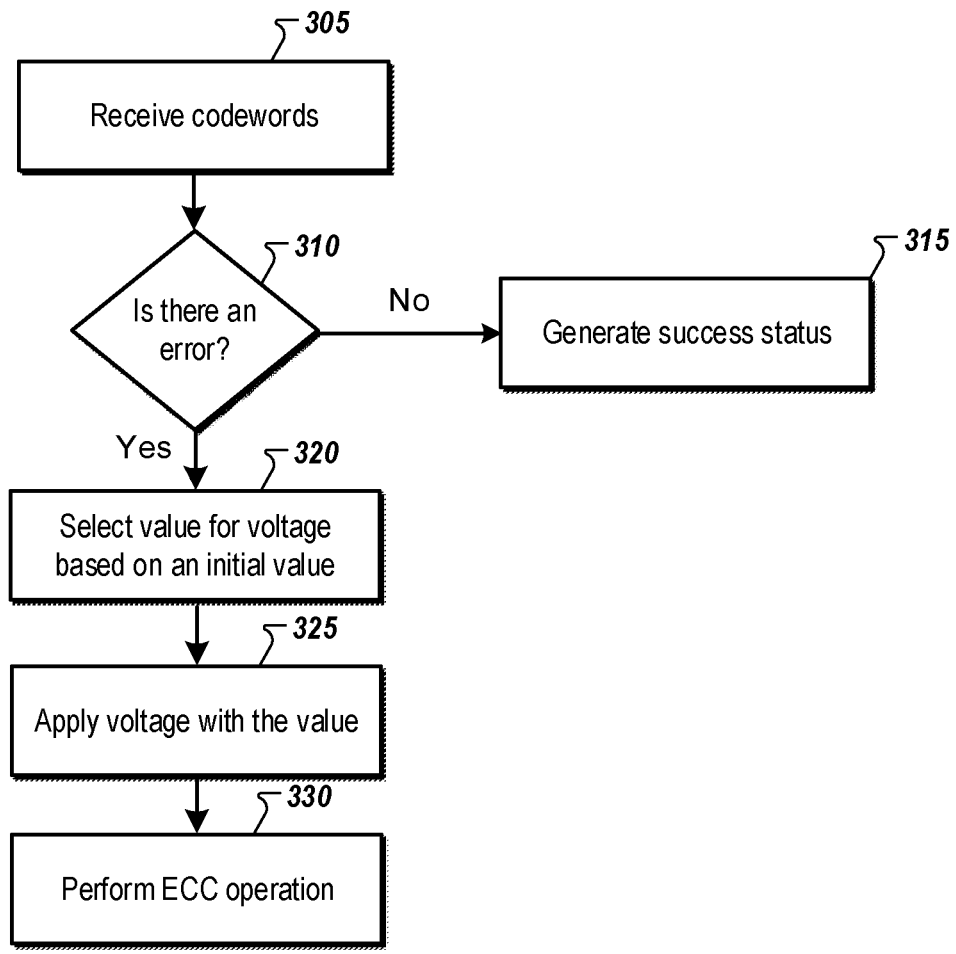
FIG. 3 is a flow diagram of an example method for an automated voltage demarcation adjustment in a recovery operation.

FIG. 3 is a flow diagram of an example method 300 to select a VDM autonomously for a recovery operation at a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the VDM selector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic can receive codewords stored at a page of a memory device. For example, a memory device can write multiple codewords to a page and the processing logic can receive all of the codewords from the page.

At operation 310, the processing logic can determine whether there is an error or corrupted data in one or more codewords received from the page based on an error operation performed by the processing logic. In at least on embodiment, a codeword stored at the page can become corrupted due to threshold drift, media degradation, or other electrical noise. Accordingly, when the processing logic attempts to read the codewords, the processing logic can determine a codeword is corrupt if one or more bits stored at the codeword flip—e.g., an error correction operation reveals one or more errors. If the processing logic determines there is an error, the processing logic can proceed to operation 320. If there is not an error, processing logic can proceed to operation 315.

At operation 315, the processing logic can generate a success status. In some embodiments, if the processing logic determines there is no errors, the processing logic can generate a success status for the operation—e.g., notify a component of the processing logic that there are no errors and refrain from performing additional steps.

At operation 320, the processing logic can select a value for a VDM voltage to be applied to the memory cells as part of the recovery of corrupted codewords. In at least some embodiments, the processing logic can recover a respective codeword by applying different VDMs (e.g., the bit that erroneously flipped during a first read can flip back based on a new VDM during a second read). In some embodiments, the processing logic can apply the same VDM voltage utilized for a read operation before the recovery operation—e.g., an initial VDM. In some embodiments, there can be a maximum number of times the processing logic can repeat the process of 310-330 (e.g., threshold number of operations to recover the codewords or maximum number of recovery steps). If the processing logic determines there are still recovery steps available, the processing logic can continue to repeat the process—e.g., the current recovery step does not match the threshold number. In such embodiments, the processing logic can select a different VDM value. In some embodiments, the VDM value is selected by increasing the previous VDM value. For example, if the processing logic chooses a first voltage value for the VDM in a first step, the processing logic can choose a second voltage value (e.g., greater than the first) for a second step. If the processing logic determines the recovery steps have been exhausted, the processing logic can generate a status for each codeword.

At operation 325, the processing logic can apply a VDM with the value selected at operation 320. Accordingly, the processing logic can determine logical values of memory cells storing the codeword. In some embodiments, applying a different VDM value can enable the processing logic to reduce errors in the codeword—e.g., increasing the VDM value can enable a bit to revert back to its original value.

At operation 330, the processing logic can perform an error correction operation (ECC) subsequent to performing the read operation with the VDM at the selected. The processing logic can determine if a number of errors in the codeword (or the number of codewords with errors) is reduced at the respective VDM value chosen. The processing logic can proceed to repeat operations 310-330 when the maximum number of recovery steps (e.g., recovery operations) is not satisfied.

Figure 4:
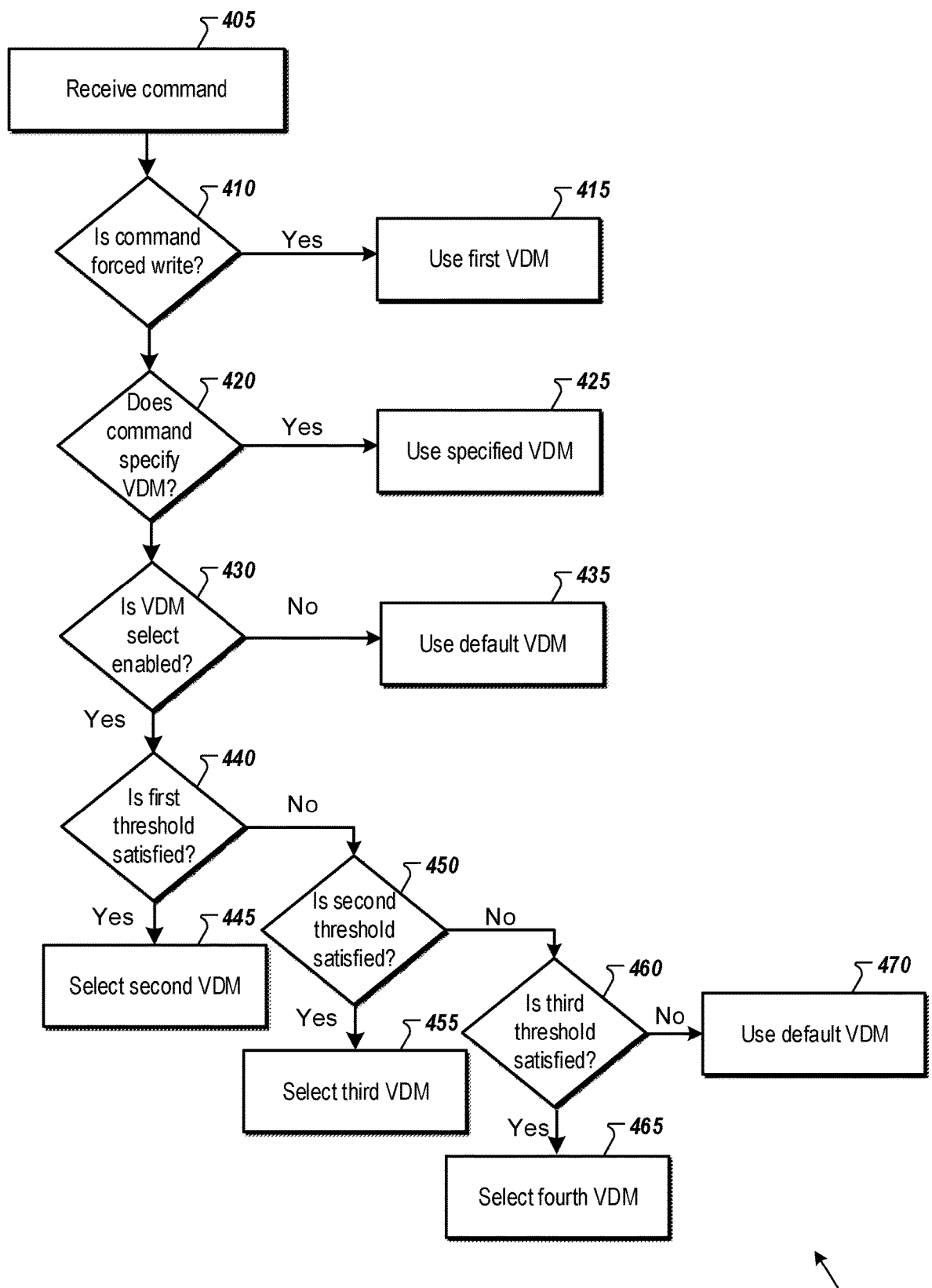
FIG. 4 is a flow diagram of an example method for automated voltage demarcation adjustment for a memory device.

FIG. 4 is a flow diagram of an example method 400 to select a VDM autonomously for a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the VDM selector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a memory sub-system controller (e.g., memory sub-system controller 115) can receive a command from a host system (e.g., host system 120). In at least one embodiment, the command received can be a read command, a write command, or a force write command.

At operation 410, the memory sub-system controller can determine whether the command received was a force write command. In at least one embodiment, the memory sub-system controller can determine if the command received is a force write command by reading the command fields of the command. If the memory sub-system controller determines the command is a force write command, the memory sub-system controller can proceed to operation 415. If the memory sub-system controller determines the command is not a forced write command, the memory sub-system controller can proceed to operation 420.

At operation 410, the memory sub-system controller can apply a VDM having a first value (e.g., a voltage with a first magnitude or VDM0). In at least one embodiment, the memory sub-system controller can apply the first VDM each time a force write command is received. That is, when performing a write back operation, the memory sub-system controller can use the first VDM while reading the logic values stored at the memory cells.

At operation 420, the memory sub-system controller can determine whether the command received specifies a VDM value to use. In at least one embodiment, the memory sub-system controller can read a VDM read enable field of the command. If the memory sub-system controller determines the read enable field of the command stores a '1', the memory sub-system controller can proceed to operation 425—e.g., determine the command specifies a VDM value. If the memory sub-system controller determines the read enable field of the command stores a '0', the memory sub-system controller can proceed to operation 430—e.g., determine the command does not specify a VDM value.

At operation 425, the memory sub-system controller can select the VDM value specified in the command. For example, the memory sub-system controller can read the value specified in the command based on determining the command stores a '1' in the read enable field. In at least one embodiment, the memory sub-system controller can compare the value specified in the command with a VDM maximum value and a VDM minimum value stored at a register of the memory sub-system controller. In some embodiments, the VDM maximum value and VDM minimum value can be associated with maximum and minimum operational threshold values of memory cells of the memory sub-system—e.g., the memory cells can fail at voltages greater than or less than the VDM maximum and VDM minimum voltage. Accordingly, the memory sub-system controller can check each selected VDM value with the VDM maximum and VDM minimum, including the VDM specified in the command. If the VDM value selected is above the VDM maximum value, the memory sub-system controller can select the VDM maximum value to apply to the memory cells. If the VDM value is below the VDM minimum value, the memory sub-system controller can select the VDM minimum value to apply to the memory cells.

At operation 430, the memory sub-system controller can determine whether the VDM selection is enabled. In at least on embodiment, the memory sub-system controller can store a value (e.g., read or write threshold enabled) at a register. In at least one embodiment, the memory sub-system controller can store a '1' at the register to enable the VDM selection. In some embodiments, the memory sub-system controller can store a value '0' at the register to disable the VDM selection. In some embodiments, the whether the memory sub-system controller enable or disables the VDM selection can depend on a voltage drift rate of memory cells, a read latency of the memory device, or a preference selected by a user or host system of the memory system. After receiving the command, if the memory sub-system controller reads a value '0' at the register, the memory sub-system controller can proceed to operation 435. If the memory sub-system controller reads a value '1' at the register, the memory sub-system controller can proceed to operation 440.

At operation 435, the memory sub-system controller can select a default VDM value. In at least one embodiment, the default VDM value can be dependent on a maximum threshold voltage of the memory cells or a threshold drift rate of the memory cells. For example, the memory sub-system controller can select a relatively high threshold voltage if the threshold drift rate is high—e.g., a higher VDM value can help compensate a higher threshold drift rate. In some examples, the default VDM value can be the first VDM, the second VDM, the third VDM, or the fourth VDM used by the memory sub-system controller in other operations described herein.

At operation 440, the memory sub-system controller can determine whether a first threshold criterion is satisfied. In at least on embodiment, the memory sub-system controller can select a VDM value based on predetermined threshold values and a period of time elapsed since a most recent write operation at a given SMU. That is, the memory sub-system controller can select a different VDM value for different SMUs based on when a previous write operation was performed at the respective SMU. In at least one embodiment, the memory sub-system controller can select from threshold criterion that are based on a maximum threshold value or threshold drift rate of a memory cell. For example, the memory sub-system controller can use a high threshold value for a high VDM as more time has elapsed since a write operation and the drift is more significant than if less time had passed. Similarly, the memory sub-system controller can select from VDM values that are in between the VDM maximum and VDM minimum. In at least one example, each VDM threshold is stored at one or more registers—e.g., each in one register or each in a different register. The memory sub-system controller can compare the threshold criteria stored at the register(s) to the period of time since the most recent write operation. As described with reference to FIG. 2, the memory sub-system controller can determine the period of time elapsed by storing a writestamp when a write operation is performed at a respective SMU. The memory sub-system controller can also track a current time (e.g., current timestamp or SMU timestamp) and determine the time elapsed by taking a difference between the current time and the time of the writestamp. The memory sub-system controller can then compare the period of time elapsed with the first threshold. In some embodiments, the first threshold can be the highest threshold—e.g., the threshold associated with the most period of time elapsed. If the memory sub-system controller determines the time elapsed since the last write operation is greater than or equal to the first threshold, the memory sub-system controller can proceed to operation 445 and select a second VDM value (e.g., VDM3). If the memory sub-system controller determines the time elapsed is less than the first threshold, the memory sub-system controller can proceed to operation 450.

At operation 450, the memory sub-system controller can determine if the second threshold is satisfied. In at least on embodiment, memory sub-system controller can compare the determined period of time elapsed since the most recent write operation with a second threshold criterion. In at least one embodiment, the second threshold value is less than the first threshold value—e.g., less time elapsed since the write operation. In at least one embodiment, if the memory sub-system controller determines the time elapsed since the last write operation is greater than or equal to the second threshold, the memory sub-system controller can proceed to operation 455 and select the third VDM value (e.g., VDM2). In at least on embodiment, the third VDM is less than the second VDM—e.g., because less time has elapsed, the magnitude of the VDM is not as great. If the memory sub-system controller determines the period of time elapsed is less than the second threshold, the memory sub-system controller can proceed to operation 460.

At operation 460, the memory sub-system controller can determine if the third threshold is satisfied. In at least on embodiment, memory sub-system controller can compare the determined time elapsed since the last write operation with a third threshold criterion. In at least one embodiment, the third threshold value is less than the first threshold value and the second threshold value—e.g., less time elapsed since the most recent write operation. In at least one embodiment, if the memory sub-system controller determines the time elapsed since the last write operation is greater than or equal to the third threshold, the memory sub-system controller can proceed to operation 465 and select the fourth VDM value (e.g., VDM1). In at least on embodiment, the first VDM is less than the second and third VDM—e.g., because less time has elapsed, the magnitude of the VDM is not as great. If the memory sub-system controller determines the time elapsed is less than the second threshold, the memory sub-system controller can proceed to operation 470.

At operation 470, the memory sub-system controller can select the default VDM value. That is, the memory sub-system can go through each stored threshold criterion. If the memory sub-system controller exhausts all the thresholds stored, the memory sub-system controller can use the default value to determine the logic of the memory cells.

Figure 5:
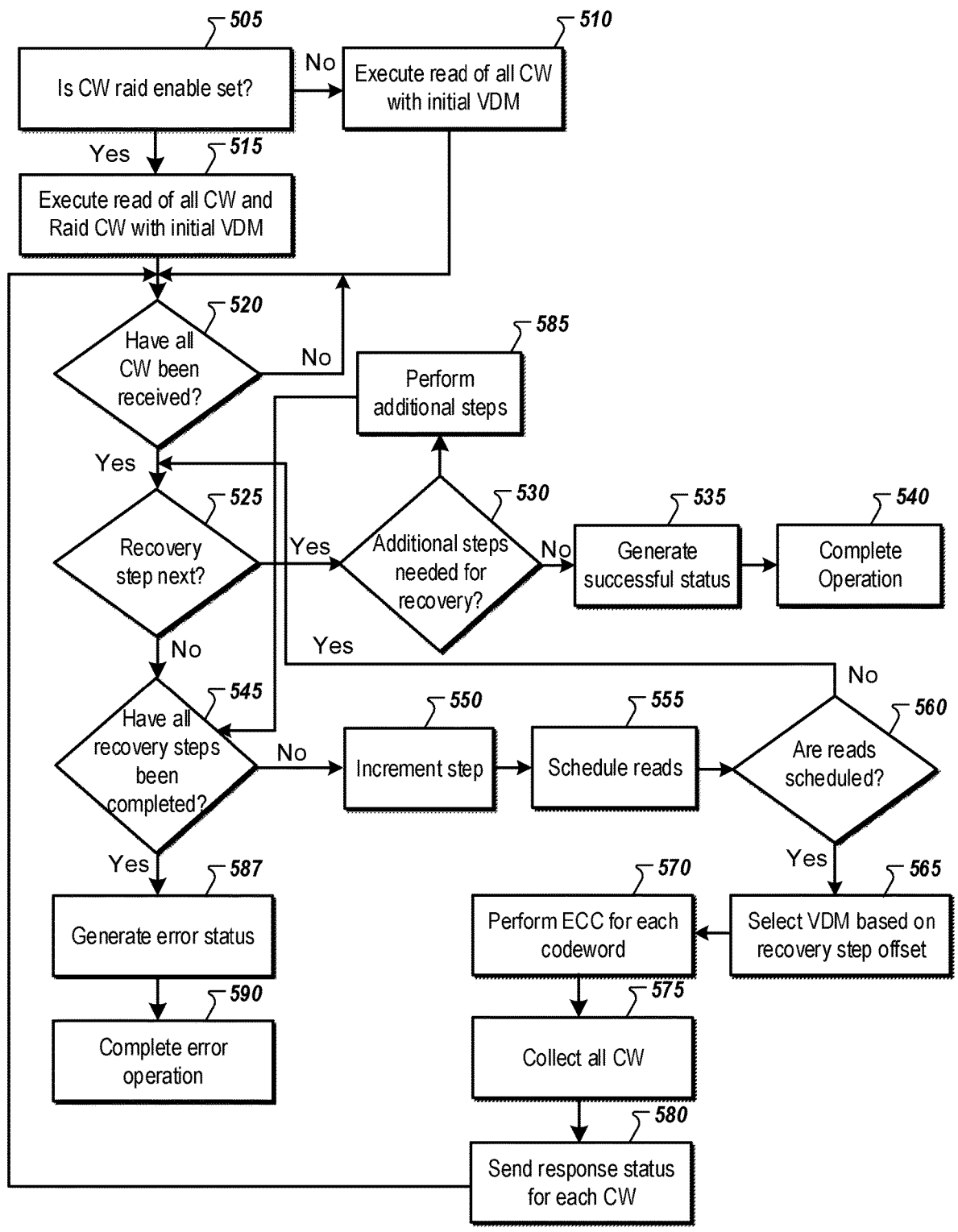
FIG. 5 is a flow diagram of an example method for an automated voltage demarcation adjustment in a recovery operation.

FIG. 5 is a flow diagram of an example method 500 to select a VDM autonomously for a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the VDM selector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the memory sub-system controller can determine if a codeword raid enable set. In at least one embodiment, the memory sub-system controller can attempt to recover corrupted codewords. In such embodiments, the memory sub-system controller can read the corrupted codewords and attempt to recover them. In some embodiments, the memory sub-system controller can read all non-corrupted codewords and redundancy metadata (e.g., parity bit or XOR bit) associated with all of the codewords in a page to reconstruct (e.g., determine which bits were inverted) the codeword. That is, the memory sub-system controller can read all of the non-corrupted codewords and compare them with the XOR to determine where errors are in the corrupted codewords. Such an operation can be known as a raid. Accordingly, if the memory sub-system controller determines the raid codeword read enable is set (e.g., a register storing the value is a '1'), the memory sub-system controller can proceed to operation 515. If the memory sub-system controller determines the raid codeword read enable is not set (e.g. the register stores a value '0'), the memory sub-system controller can proceed to operation 510.

At operation 510, the memory sub-system controller can read all of the codewords with an initial VDM. In at least one embodiment, when the raid codeword read enable is not set, the memory sub-system controller can refrain from reading the redundancy metadata associated with all the codewords of the page (e.g., the parity bit or XOR value). Accordingly, the memory sub-system controller can read the corrupted codewords at an initial VDM. In at least one embodiment, the initial VDM can be the VDM at which the memory sub-system controller performed a last read operation—e.g., the last voltage selected with operations 405-470 as described with reference to FIG. 4.

At operation 515, the memory sub-system controller can read all of the codewords (including non-corrupted codewords and the parity bit) with an initial VDM. In at least one embodiment, when the raid codeword read enable is set, the memory sub-system controller can read the parity bit. Accordingly, the memory sub-system controller can read all the codewords at an initial VDM. In at least one embodiment, the initial VDM can be the VDM at which the memory sub-system controller performed a last read operation—e.g., the last voltage selected with operations 405-470 as described with reference to FIG. 4

At operation 520, the memory sub-system controller can determine if all codewords have been received. In at least one embodiment, if the memory sub-system controller determines all the codewords have been received (e.g., all the data stored at a given page), the memory sub-system controller can proceed to operation 525. If the memory sub-system controller determines the not all codewords have been received, the memory sub-system controller can wait until all codewords are received—e.g., loop back to the start of operation 520.

At operation 525, the memory sub-system controller determines if the recovery step is next. In at least one embodiment, after reading the codewords at the initial VDM, the memory sub-system controller can determine there are errors in one or more codewords at the initial VDM— e.g., an error operation after reading the data at the VDM can show one or more bits flipped logic values. In such embodiments, the memory sub-system controller can proceed to operation 545. In some embodiments, the memory sub-system controller can determine either no errors or additional operations will be performed before trying to recover the codewords. In such embodiments, the memory sub-system controller can proceed to operation 530.

At operation 530, the memory sub-system controller can determine whether additional steps will be performed before attempting to recover one or more corrupted codewords. In at least one embodiment, the memory sub-system controller can determine if additional steps are to be performed by comparing a number of bit flip (e.g., a bit flip count (BFC)) or a number of bits going from a logic '0' to a logic '1' (e.g., ZO count) with a threshold value. In at least one embodiment, the bit flip count can show the number of bits that flipped a logic value (e.g., from '1' to '0' or from '0' to '1'). The memory sub-system controller can compare the BFC with a threshold number of flipped bits the memory sub-system can tolerate before the memory system suffers a drop in performance. In at least one embodiment, the memory sub-system controller can compare the ZO threshold with a threshold number of bits going from '0' to '1' the memory system can tolerate. If either the BFC or the ZO count exceed or match the BFC threshold or ZO threshold, the memory sub-system controller can proceed to operation 585. If the memory sub-system controller the ZO count or BFC count are less than the respective threshold, the memory sub-system controller can determine a number of codewords corrupted. If the memory sub-system controller determines zero (0) codewords are corrupted, the memory sub-system controller can proceed to step 535. If the memory sub-system controller determines there are two or more corrupted codewords, the memory sub-system controller can proceed to step 585. If the memory sub-system controller determines there is one (1) corrupted codeword, the memory sub-system controller can determine if raid is enabled at this step. If the raid is enabled, the memory system can either apply the raid and proceed to operation 535 or determine the raid codeword (e.g., parity bit) is uncorrectable and proceed to operation 535.

At operation 535, the memory sub-system controller can generate a status indicating a success of the recovery operation. After generating the successful status, the memory sub-system controller can proceed to operation 540.

At operation 540, the memory sub-system controller can complete the recovery operation. In one embodiment, the memory sub-system controller can complete the operation by collecting a status for each codeword. The memory sub-system controller can trigger an even interrupt to a host system if the error threshold is met. That is, if the number of errors in the codewords or a number of corrupted codewords is greater than an error threshold (a number of errors after which the memory sub-system is inoperable or has too many errors), the memory sub-system controller can notify the host system to stop operations and fix the corrupted codewords. In at least one embodiment, the memory sub-system controller can determine whether data is to be written back. If the memory sub-system controller determines data is to be written back, the memory sub-system controller can select a VDM value, read data from the memory device, and write the data back. In at least one embodiment, the memory sub-system controller can select the VDM value based on the ZO count or BFC count. In such embodiments, the memory sub-system controller can store different thresholds at a register. If the count exceeds a respective threshold, the memory sub-system controller can select a VDM value associated with the highest threshold— e.g., in a method similar to the method described with reference to FIG. 4. That is, the memory sub-system controller can select a higher VDM if the BFC count or ZO count is high as more drift can have occurred. The memory sub-system controller can hold the memory sub-system until the writeback operation is complete. If the memory sub-system controller determines a writeback is not to be performed, the memory sub-system controller can end the operation.

At operation 585, the memory sub-system controller can complete additional steps before the recovery is implemented. In at least one embodiment, the memory sub-system controller can schedule reads before attempting to recover the one or more corrupted codewords. For example, memory sub-system controller can schedule reads of all codewords having a ZO count or BFC count that is greater than the threshold. In an embodiment, the memory sub-system controller can schedule a read for all codewords with ECC failures when one or more codewords are corrupted—e.g. schedule a read for one codeword when raid is not enabled for the step described with reference to operation 530.

At operation 545, the memory sub-system controller can determine whether a number of recovery steps have been exhausted—e.g. a threshold number of recovery steps have been attempted. In at least one embodiment, the number of recovery steps can be based on a number of possible VDM values the memory sub-system controller can select. That is, in some embodiments, each recovery step includes applying a different VDM voltage, and the memory sub-system controller can continue to perform additional recovery steps until all possible VDMs are applied. As described above, the memory sub-system controller can utilize a VDM maximum and a VDM minimum to ensure a VDM applied during the recovery step is not greater than or less than an operable voltage for a memory cell. If the memory sub-system controller determines all recovery steps are exhausted, the memory sub-system controller can proceed to operation 587.

If the memory sub-system controller determines additional recovery steps are possible, the memory sub-system controller can proceed to operation 550.

At 550, the memory sub-system controller can increase a step count to track a number of recovery steps performed. For example, the memory sub-system controller can increase the count by one (1) each time a recovery step is performed. Accordingly, the memory sub-system controller can determine the recovery steps are exhausted when the recovery step number is the same as the number of possible recovery steps.

At operation 555, the memory sub-system controller can schedule reads at the memory device. In at least one embodiment, the memory sub-system controller can schedule reads of corrupted codewords to attempt to recover the corrupted codewords. In some embodiments, the memory sub-system controller can schedule reads of uncorrupted codewords and the raid codeword to attempt to recover the corrupted codewords. After scheduling the reads, the memory sub-system controller can proceed to operation 560.

At operation 560, the memory sub-system controller can determine whether the reads have been scheduled. If the memory sub-system controller determines the reads are scheduled, the memory sub-system controller can proceed to operation 565. If the memory sub-system controller determines the reads are not scheduled (e.g., additional reads are needed), the memory sub-system controller can return to operation 525.

At operation 565, the memory sub-system controller can select a VDM value based on a previous VDM (e.g., an initial VDM or VDM utilized in a previous recovery step). In at least one embodiment, the memory sub-system controller can increase the value of the VDM each time a recovery step is performed—e.g., increase to a higher VDM when going from a first recovery step to a second recovery step. In at least one embodiment, the increase can be referred to as an offset. If the offset is one (1) (e.g., a recovery step after the initial recovery step), the memory sub-system controller can increase the VDM from the initial VDM to the subsequent second VDM. If the offset is two (2)—e.g., a recovery step after the offset one (1) recovery step, the memory sub-system controller can increase the VDM from the initial value to a VDM subsequent to the second VDM, and so forth. Accordingly, the memory sub-system controller can increase the VDM each recovery step and try to mitigate drift affects—e.g., a higher VDM can reduce inaccurate readings. In at least one embodiment, the memory sub-system controller can check the selected VDM with the VDM maximum to ensure the selected VDM does not exceed the operable threshold of the memory cell. If the memory sub-system controller determines the VDM selected does exceed the VDM maximum, the memory sub-system controller can apply the maximum VDM instead. For example, if the memory sub-system controller has an initial VDM having a highest possible value (e.g., VDM3), the memory sub-system controller can forgo increasing the VDM value in a subsequent recovery step.

At operation 570, the memory sub-system controller can perform an ECC operation for each codeword that was read. In some embodiments, the memory sub-system controller can perform a CRC check on the codewords. In at least one embodiment, the memory sub-system controller can perform an error operation at each codeword of each channel of the memory device. In at least one embodiment, the memory sub-system controller can use the error correction to determine if a different VDM reduced a number of errors.

At operation 575, the memory sub-system controller can store all requested codewords in a buffer (e.g., LBUFF). In at least one embodiment, the memory sub-system controller can store all corrupted codewords in the buffer based on the raid enable being off. In another embodiment, the memory sub-system controller can store all codewords (including raid codewords/parity bits) when the raid is enabled.

At operation 580, the memory sub-system controller can send a response status for each codeword requested to a media manager.

At operation 587, the memory sub-system controller can generate an error status for the requested codewords—e.g., how many errors are present, number of corrupted codewords, success of the recovery, etc.

At operation 590, the memory sub-system controller can complete the error correction operation as described with reference to operation 540—e.g., trigger an event interrupt if a number of errors exceeds a threshold.

Figure 6:
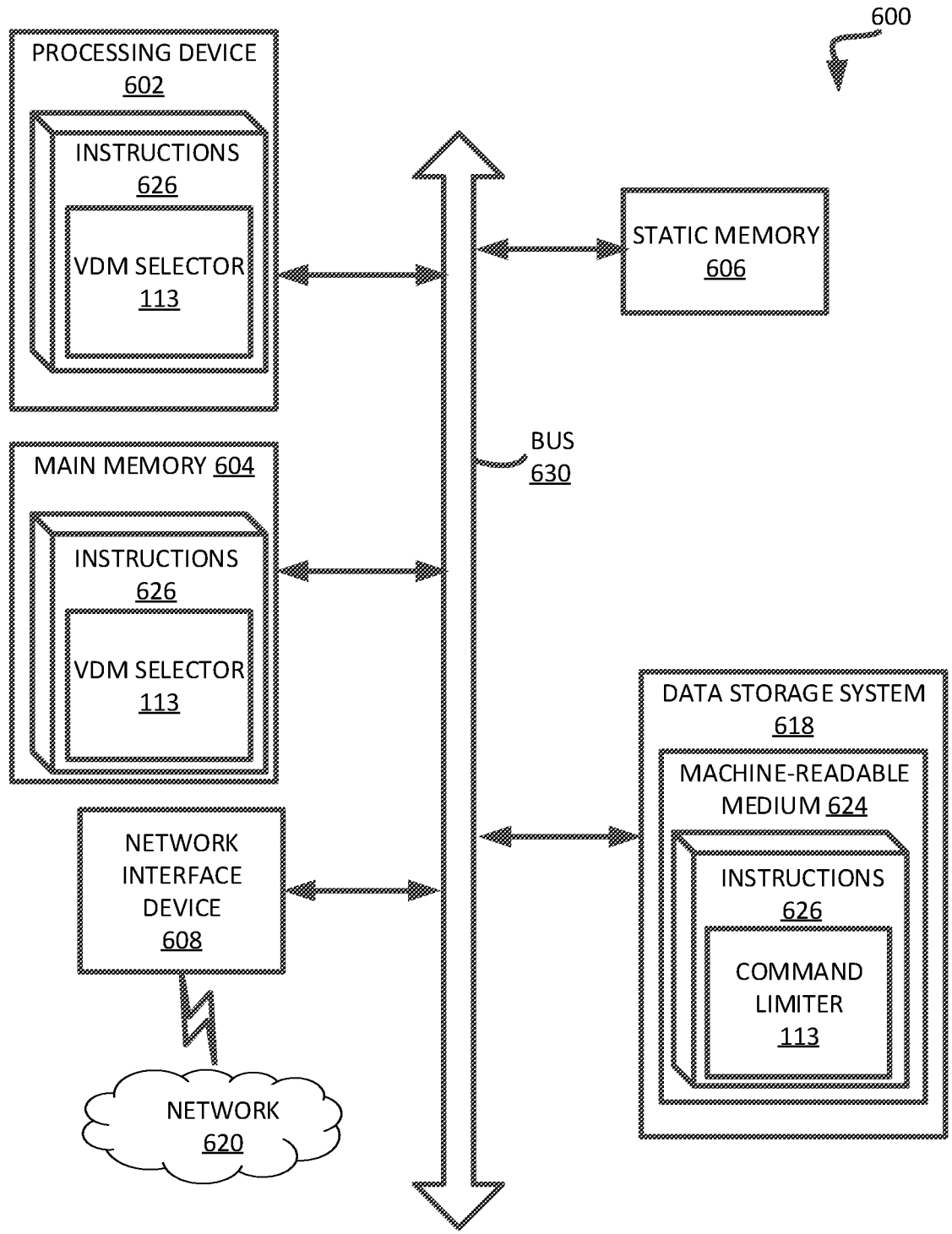
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the VDM selector 113 of FIG. 1 to select a VDM). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a VDM selector 113 (e.g., the VDM selector 113 of FIG. 1) to limit commands received at the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
receiving a memory access command with respect to a set of memory cells of the memory device;
determining whether the memory access command specifies a first voltage demarcation (VDM) value;
responsive to determining that the memory access command does not specify the first VDM value, determining a period of time elapsed since a most recent write operation performed with respect to the set of memory cells;
responsive to determining that the period of time is below a first threshold period of a plurality of periods, comparing the period of time to a second threshold period of the plurality of periods, wherein the first threshold period is a highest threshold period of the plurality of periods;
responsive to determining that the period of time exceeds the second threshold period, selecting a second VDM value of a plurality of predefined VDM values corresponding to respective threshold periods, wherein the second VDM value corresponds to the second threshold period; and utilizing the second VDM value for performing a memory access operation specified by the memory access command.

2. The system of claim 1, wherein the operations further comprise:
responsive to determining that the memory access command specifies the first VDM value, utilizing the first VDM value for performing a memory access operation specified by the memory access command.

3. The system of claim 1, wherein the operations further comprise:
determining whether a register stores a first configuration or a second configuration, wherein selecting the second VDM is performed responsive to determining the register stores the first configuration.

4. The system of claim 3, wherein the operations further comprise:
responsive to determining the register stores the second configuration, selecting a default VDM value.

5. The system of claim 1, wherein determining the time elapsed since the most recent write operation further comprises:
storing a first time value associated with performing a previous write operation at the memory device; and
calculating a difference between a current time value and the first time value.

6. The system of claim 5, wherein the operations further comprise:
receiving a second memory access command to perform a write operation;
storing a third time value associated with performing the write operation corresponding to the second memory access command; and
calculating a difference between the current time value and the third time value.

7. The system of claim 1, wherein the operations further comprise:
receiving a second memory access command;
determining whether the second memory access command specifies a third VDM value;
responsive to determining that the memory access command does not specify the third VDM value, selecting, based on a second period of time elapsed since the most recent write operation performed with respect to the set of memory cells, a fourth VDM value from the plurality of predefined VDM values; and
utilizing the fourth VDM value for performing a second memory access operation specified by the second memory access command.

8. The system of claim 1, wherein the memory access command is one of: a read command or a write command.

9. A method, comprising:
receiving a memory access command with respect to a set of memory cells of a memory device;
determining whether the memory access command specifies a first voltage demarcation (VDM) value;
responsive to determining that the memory access command does not specify the first VDM value, determining a period of time elapsed since a most recent write operation performed with respect to the set of memory cells;
responsive to determining that the period of time is below a first threshold period of a plurality of periods, comparing the period of time to a second threshold period of the plurality of periods, wherein the first threshold period is a highest threshold period of the plurality of periods;

responsive to determining that the period of time exceeds the second threshold period, selecting a second VDM value of a plurality of predefined VDM values corresponding to respective threshold periods, wherein the second VDM value corresponds to the second threshold period; and
utilizing the second VDM value for performing a memory access operation specified by the memory access command.

10. The method of claim 9, further comprising:
responsive to determining that the memory access command specifies the first VDM value, utilizing the first VDM value for performing a memory access operation specified by the memory access command.

11. The method of claim 9, further comprising:
determining whether a register stores a first configuration or a second configuration, wherein selecting the second VDM value is performed responsive to determining the register stores the first configuration.

12. The method of claim 11, further comprising:
responsive to determining the register stores the second configuration, selecting a default VDM value.

13. The method of claim 9, wherein to determine a duration subsequent to a previous write operation, the method further comprises:
storing a first time value associated with performing the previous write operation at the memory device; and
calculating a difference between a current time value and the first time value.

14. The method of claim 13, further comprising:
receiving a second memory access command to perform a write operation;
storing a third time value associated with performing the write operation corresponding to the second memory access command; and
calculating a difference between the current time value and the third time value.

15. The method of claim 9, further comprising:
receiving a second memory access command;
determining whether the second memory access command specifies a third VDM value;
responsive to determining that the memory access command does not specify the third VDM value, selecting, based on a second period of time elapsed since the most recent write operation performed with respect to the set of memory cells, a fourth VDM value from the plurality of predefined VDM values; and
utilizing the fourth VDM value for performing a second memory access operation specified by the second memory access command.

16. The method of claim 9, wherein the command is one of: a read command or a write command.

17. A non-transitory computer readable medium comprising instructions, which when executed by a processing device, cause the processing device to perform operations comprising:
receive a memory access command with respect to a set of memory cells of a memory device;
determining whether the memory access command specifies a first voltage demarcation (VDM) value;
responsive to determining that the memory access command does not specify the first VDM value, determining a period of time elapsed since a most recent write operation performed with respect to the set of memory cells;
responsive to determining that the period of time is below a first threshold period of a plurality of periods, comparing the period of time to a second threshold period of the plurality of periods, wherein the first threshold period is a highest threshold period of the plurality of periods;

responsive to determining that the period of time exceeds the second threshold period, selecting a second VDM value of a plurality of predefined VDM values corresponding to respective threshold periods, wherein the second VDM value corresponds to the second threshold period; and utilizing the second VDM value for performing a memory access operation specified by the memory access command.

18. The non-transitory computer readable medium of claim 17, wherein the operations further comprise:

responsive to determining that the memory access command specifies the first VDM value, utilizing the first VDM value for performing a memory access operation specified by the memory access command.

19. The non-transitory computer readable medium of claim 17, wherein the operation further comprise:

determining whether a register stores a first configuration or a second configuration, wherein selecting the second VDM value is performed responsive to determining the register stores the first configuration.

20. The non-transitory computer readable medium of claim 19, wherein the operations further comprise:

responsive to determining the register stores the second configuration, selecting a default VDM value.

* * * * *